United States Patent
Matsumura et al.

(10) Patent No.: US 6,370,675 B1
(45) Date of Patent: *Apr. 9, 2002

(54) SEMICONDUCTOR INTEGRATED CIRCUIT DESIGN AND EVALUATION SYSTEM USING CYCLE BASE TIMING

(75) Inventors: Hidenobu Matsumura; Hiroaki Yamoto; Koji Takahashi, all of Santa Clara, CA (US)

(73) Assignee: Advantest Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,892

(22) Filed: Aug. 18, 1998

(51) Int. Cl.[7] .................................................. G06F 17/50

(52) U.S. Cl. ............................................ 716/6; 714/738

(58) Field of Search ............................ 716/4, 17, 2, 6, 716/18; 714/738

(56) References Cited

U.S. PATENT DOCUMENTS 5,619,512 A * 4/1997 Kawashima ................ 714/733

* cited by examiner

Primary Examiner—Matthew Smith
Assistant Examiner—Thuan Do
(74) Attorney, Agent, or Firm—Muramatsu & Associates

(57) ABSTRACT

A semiconductor integrated circuit design and evaluation system for designing an LSI device under an electric design automation (EDA) environment and for evaluating a test pattern produced based on the CAD data derived in the design stage of the LSI device. The system includes an EDA environment for designing an LSI device and evaluating functions of the designed LSI device by a device logic simulator, a dump file for storing data expressed by an event base obtained by executing the device logic simulation, an LSI tester simulator for generating a test pattern and an expected value pattern in a cycle base, a cycle-event converter for converting the test pattern from the LSI tester simulator in the cycle base to a test pattern of the event base, a first memory for storing the event based test pattern from the cycle-event converter, a second memory for storing the data from the dump file, and a comparator for synchronizing the data stored in the first and second memories by comparing the timing relationship between the two and extracting output data of the device under test from the dump file corresponding to the test pattern from the LSI tester simulator.

10 Claims, 5 Drawing Sheets

```
LPATxx1
       I I O O C
       N N T T K
NOP/T1 0 0 L X 1   — Cycle 1
NOP/T1 1 1 H L 1   — Cycle 2
NOP/T2 1 1 L X 1   — Cycle 3
```

SEMICONDUCTOR INTEGRATED CIRCUIT DESIGN AND EVALUATION SYSTEM USING CYCLE BASE TIMING

FIELD OF THE INVENTION

This invention relates to a design and evaluation system for designing and evaluating semiconductor integrated circuits such as a large scale integrated circuit (LSI), and more particularly, to a semiconductor integrated circuit design and evaluation system for evaluating, at high speed, a test pattern produced for a semiconductor test system or performing a diagnostic test on the design of the semiconductor integrated circuit, based on logic simulation data produced in a design stage of the semiconductor integrated circuit through a CAD (computer aided design) process, without using an actual semiconductor test system or semiconductor integrated circuit to be tested.

BACKGROUND OF THE INVENTION

In a process of developing semiconductor integrated circuits such as a large scale integrated circuit (LSI), almost always, a design method using a computer aided design (CAD) tool is employed. Such a design environment using a CAD tool is also refereed to as an electronic design automation (EDA) environment. In such a semiconductor development process incorporating the CAD tool, desired semiconductor circuits are created in an LSI with the use of a hardware description language such as VHDL and Verilog. Also in this process, functions of the semiconductor circuits thus designed are evaluated through a software simulator called a device logic simulator.

A device logic simulator includes an interface commonly called a testbench through which test data (vector) is applied to the device data showing the intended semiconductor circuits and the resultant response of the intended semiconductor circuits are evaluated.

After the design stage of the LSI circuit, actual LSI devices are produced and are tested by a semiconductor test system such as an LSI tester to determine whether the LSI devices perform the intended functions properly. An LSI tester supplies a test pattern (test vector) to an LSI device under test and compares the resultant outputs of the LSI device with expected data to determine pass/fail of the LSI device. For testing an LSI device with higher level of functionality and density, a test pattern to be applied to the LSI device must accordingly be complex and lengthy, resulting in significantly large work load and work hours in producing the test pattern. Therefore, it is not preferable to produce a test pattern when an LSI device under test is actually produced, especially as to LSI devices of shorter life cycles, because it causes a time delay to put the LSI devices into market.

Thus, to improve an overall test efficiency and productivity of the semiconductor integrated circuits, it is a common practice to make use of the data produced through the operation of the device logic simulator in an actual test of the semiconductor integrated circuits. The test procedure performed by the LSI tester in testing a semiconductor integrated circuit has a substantial similarity with a test procedure by the device logic simulator by the CAD process noted above in testing the design data of the semiconductor circuit. For example, test patterns and expected value patterns for an LSI tester to test the intended semiconductor integrated circuits are produced by utilizing the resultant data (dump file) produced by executing the device logic simulation. However, as of today, there is no system which is able to produce test patterns and expected data patterns to be used in an LSI tester and to evaluate the same, with high speed and low cost, based on the dump file derived from the design stage of the LSI devices.

In such logic simulation data, test patterns to be applied to a device model as well as the resultant outputs (expected value patterns) of the device model are expressed by an event base. Here, the event base data expresses the points of change (events) in a test pattern from logic "1" to logic "0" or vice versa with reference to the passage of time. Generally, such time passage is expressed by time lengths from a predetermined reference point or time length from a previous event. In contrast, in an actual LSI tester, test patterns are described by a cycle base. In the cycle base data, test patterns are defined relative to predetermined test cycles (tester rate) of the tester. In the event base, test patterns for the logic simulation can be described by a substantially simple form of data than that required in the cycle base.

As in the foregoing, test patterns for testing LSI devices actually produced are efficiently created by using the CAD data produced in the design stage of the LSI devices. However, because of various reasons, test patterns produced for an LSI tester in this manner may not always be appropriate to accurately detect failures of the LSI device under test. Thus, it is necessary to evaluate the test patterns produced through the foregoing procedure.

In the conventional technology, in evaluating the test patterns to be used in an LSI tester created with the use of the logic simulation data, there are basically two methods, one that uses an actual LSI tester and the other that dose not use an LSI tester. In the method of using an LSI tester, it is necessary to extract event base test patterns in the logic simulation data and convert the same to cycle base test patterns. Such test patterns in the cycle base run in the actual LSI tester to evaluate the correctness of the test patterns. This method is disadvantageous in that an expensive LSI tester is used only for evaluating an integrity of the test patterns.

In the method of not using an LSI tester, an LSI tester simulator is used for evaluating the test patterns. In this method as well, the LSI tester simulator debugs the test patterns that have been converted to the cycle base. For simulating the functions of the LSI device under test which receives the test pattern from the LSI tester simulator, a logic simulator is used which is created during the design process using the CAD tool. Since all of the evaluation process is performed through software processes, this method is disadvantageous in that it requires a very long time to finish the evaluation.

An example of the conventional technology without using the actual LSI tester is described in more detail below. FIG. 1 is an example of conventional technology for evaluating test patterns with the use of a tester simulator and a logic simulator, i.e., an example in which all of the operation is performed by software.

In FIG. 1, an LSI simulator 11 formed of software is provided with pattern data and timing data created for an LSI tester from a pattern file $10_1$ and a timing file $10_2$. The pattern data and the timing data are created, for example, by extracting pattern data and timing data from a dump file 15 resulted in performing a logic simulation in the design stage of the LSI device. An example of the logic simulator dump file is VCD (Value Change Dump) of Verilog. The data in the dump file 15 is converted to cycle base data by a conversion software 17, resulting in the pattern data and timing data noted above stored in the pattern file $10_1$ and the timing file $10_2$, respectively.

The LSI tester simulator 11 is to debug test patterns to test the intended LSI device or function of the LSI device without using an LSI tester hardware. The LSI tester simulator 11 generates a test pattern having pattern information and timing information and applies the test pattern to the logic simulator of the LSI device to be tested. The LSI tester simulator 11 compares the resultant output signals from the logic simulator with the expected data to determine the correctness of the test pattern or performances of the LSI device.

The LSI tester simulator 11 provides the test pattern to a format converter 12 as input data. The format converter 12 converts the input data from the LSI tester simulator 11 to a format to be accepted by a device logic simulator 13. Generally, the device logic simulator 13 includes an interface called PLI (Programming Language Interface). Thus, in such a case, the format converter 12 converts the test pattern to the PLI format.

The device logic simulator 13 is the simulator that has been used in the design stage of the LSI device and is formed of a logic simulator $13_1$ and a device model $13_2$ described in a language which is able to communicate with the simulator $13_1$. The device model $13_2$ simulates the operation of the LSI device to be tested. The device logic simulator 13 sends the test pattern received through the PLI interface to the device model $13_2$ and provides the resultant response from the device model $13_2$ to a format converter 14 through the PLI interface. The format converter 14 converts the output of the device model $13_2$ to a format to be received by the LSI tester simulator. The LSI tester simulator 11 compares the device output data from the format converter 14 with the expected value data. When the both data match, it is considered that the test pattern is correct.

In evaluating the test pattern solely by the software process using the device logic simulator as in the above, it requires a large amount of work and a very long processing time. The processing time by operating the device logic simulator accounts for the most part of the overall processing time. Moreover, there is a limit in the ability of the PLI interface, converter which also causes inefficiency in the evaluation.

SUMMARY OF THE INVENTION

Therefore, it is an object of the present invention to provide a semiconductor integrated circuit design and evaluation system for designing an intended LSI device through an electric design automation (EDA) process and evaluating, at high speed, a test pattern for testing the LSI device which is produced based on the CAD data developed in the design stage of the LSI device.

It is another object of the present invention to provide a semiconductor integrated circuit design and evaluation system for designing an intended LSI device through an electric design automation process and evaluating, at high speed, without using an actual LSI tester, a test pattern for testing the LSI device which is produced based on the CAD data developed in the design stage of the LSI device.

It is a further object of the present invention to provide a semiconductor integrated circuit design and evaluation system for evaluating, at high speed, with use of a small sized and dedicated hardware, a test pattern for testing an LSI device which is produced based on the CAD data developed in the design stage of the LSI device.

It is a further object of the present invention to provide a semiconductor integrated circuit design and evaluation system for evaluating, at high speed, a test pattern for testing an LSI device which is produced based on CAD data developed in the design stage of the LSI device, without using a device logic simulator but using the data produced when executing the device logic simulator.

It is a further object of the present invention to provide a semiconductor integrated circuit design and evaluation system which is capable of carrying out device fail simulation by incorporating a high speed test pattern evaluation apparatus for evaluating a test pattern for testing an LSI device which is produced based on CAD data developed in the design stage of the LSI device with a device function adding circuit which defines relationships between input signals and output signals.

It is a further object of the present invention to provide a semiconductor integrated circuit design and evaluation system which is capable of carrying out device fail simulation for an LSI device having an analog function added to a logic circuit therein by incorporating a high speed test pattern evaluation apparatus for evaluating a test pattern for testing an LSI device which is produced based on the CAD data developed in the design stage of the LSI device with a device function adding circuit which defines relationships between input signals and output signals.

In the semiconductor integrated circuit design and evaluation system of the present invention, an intended LSI device is designed through an electric design automation (EDA) process, and the function of the LSI device thus designed is tested on a computer using a device logic simulator. Event data derived from executing the device logic simulation is stored as a dump file. A cycle base test pattern to be used in an LSI tester is produced by using pattern data and timing data converted from the data in the dump file. The test pattern is synchronized with the input signal waveforms of the LSI device derived from the dump file. When the two are in the synchronized situation, the output signal waveforms of the LSI device derived from the dump file is compared with the data (expected value) at the comparison timing defined by the timing data and the pattern data. If both data match with one another, it is determined that the test pattern is appropriate. When there is a mismatch, by defining the output of the device or relationship between the input data and output data of the LSI device, the fail simulation of the LSI device can be carried out.

According to the semiconductor integrated circuit design and evaluation system of the present invention, an intended LSI device is designed through an electric design automation (EDA) process, and a test pattern and an expected value pattern are created, at high speed and low cost, through the dump file obtained in the design stage of the LSI device. In the test pattern evaluation by the present system, the device logic simulator formed of software is unnecessary, and since the test pattern is evaluated by a small size hardware dedicated to the system, the test pattern is evaluated with high speed and low cost.

DETAILED DESCRIPTION OF THE PREFERRED EMBODIMENT

Figure 2:
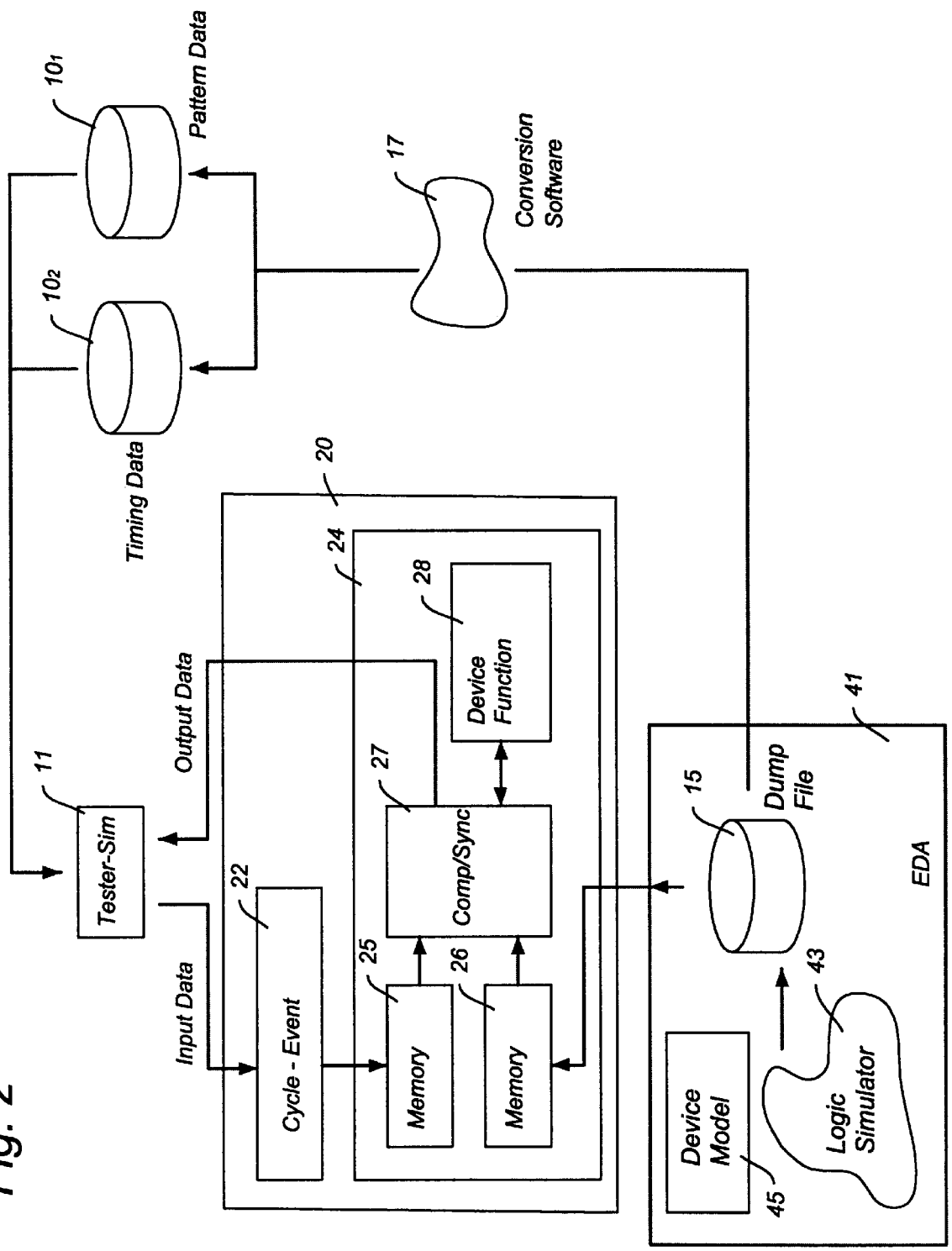
FIG. 2 is a block diagram showing a basic structure of the semiconductor integrated circuit design and evaluation system of the present invention.

The embodiment of the present invention is explained with reference to the drawings. FIG. 2 is a block diagram showing a structure of the semiconductor integrated circuit design and evaluation system of the present invention. As essential blocks, the example of FIG. 2 shows an EDA block 41 representing an electric design automation (EDA) environment, a high speed test pattern evaluation apparatus 20, and an LSI simulator 11.

In the EDA block 41, an intended LSI device is designed and its function is evaluated by a device logic simulator. In this EDA block 41, only a portion directed to the LSI device testing is illustrated. The device logic simulator is formed with a logic simulator 43 and a device model 45 described by the language that can be interpreted by the logic simulator. The device model 45 simulates the performances of the LSI device to be tested. Through the execution of the test by the device logic simulator, data showing the relationships between input and output logic signals and timings is created as a dump file. An example of such a dump file is VCD (Value Change Dump) of Verilog.

The LSI simulator 11 formed of software is provided with pattern data and timing data created for testing the LSI device by an LSI tester from a pattern file $10_1$ and a timing file $10_2$, respectively. The pattern data and the timing data are created, for example through a conversion software 17, by extracting pattern data and timing data from a dump file 15 resulted in performing a logic simulation in the design stage of the LSI device in the EDA block 41. As mentioned in the above, generally, a test pattern used in an LSI tester is formed to operate with reference to a tester rate, i.e., in the cycle base. Thus, the pattern data and timing data derived from the data in the dump file 15 are in the cycle base form.

Figure 1:
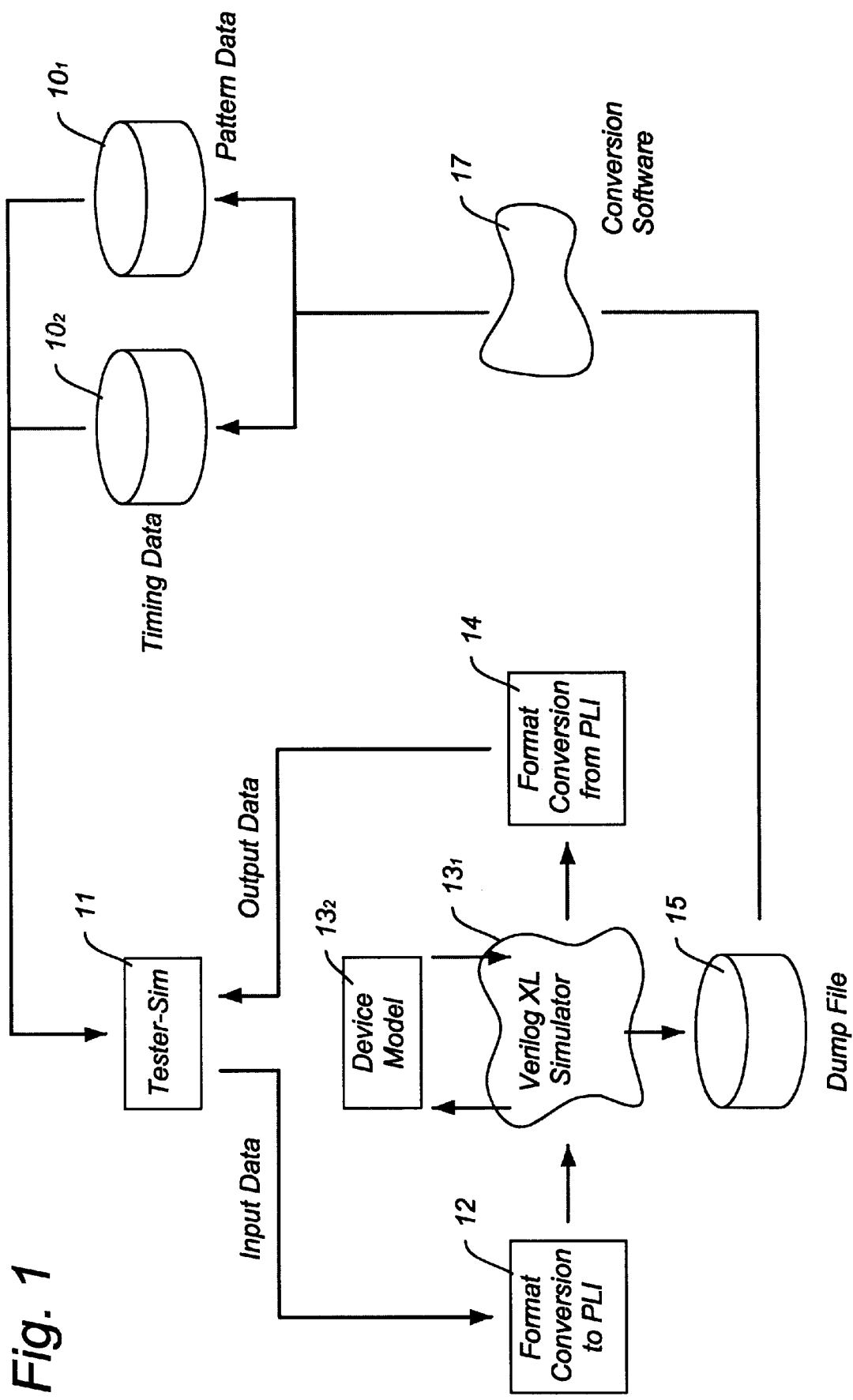
FIG. 1 is a schematic diagram showing a test pattern evaluation method in the conventional technology using a device logic simulator which is formed of software.

Also similar to the example of FIG. 1, an LSI tester simulator 11 is to debug test patterns created to test the intended LSI device or functions of the intended LSI device without using an LSI tester hardware. Based on the pattern data and timing data, the LSI tester simulator 11 generates a test pattern to be applied to the device under test and an expected value pattern to compare the output of the device under test. The LSI tester simulator 11 applies the test pattern including pattern information and timing information to the high speed pattern evaluation apparatus of the present invention and compares the resultant output data from the high speed test pattern evaluation apparatus with the expected value pattern to determine the correctness of the test pattern.

The high speed test pattern evaluation apparatus 20 includes a cycle-event converter 22 for converting the test pattern from the cycle base to the event base, an evaluation part 24 for synchronizing two event data inputs and comparing therebetween. The test pattern from the LSI tester simulator 11 is applied to the cycle-event converter 22. The cycle-event converter 22 can be configured either by software or hardware, however, to achieve a high speed operation, a hardware configuration is preferable.

Figure 3B:
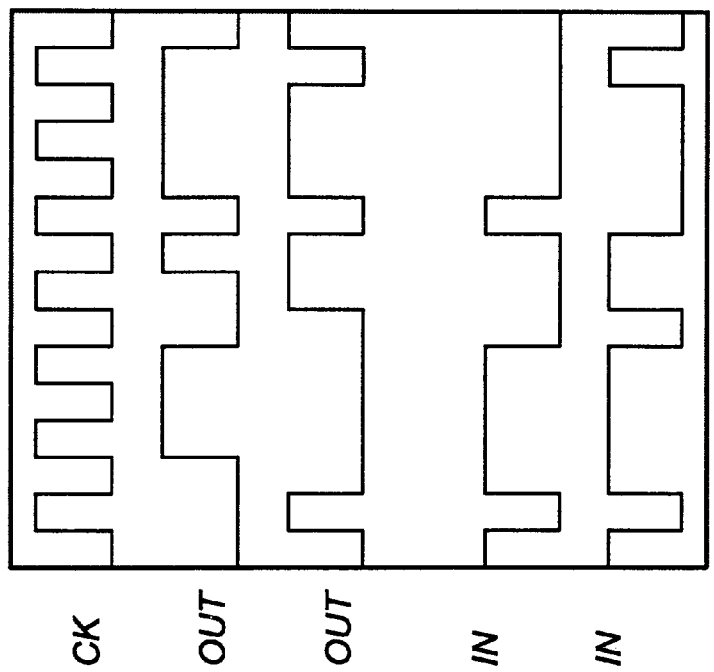
FIG. 3 is a schematic waveforms showing an image of data conversion by the cycle-event converter in the semiconductor integrated circuit design and evaluation system of the present invention.
Figure 3A:
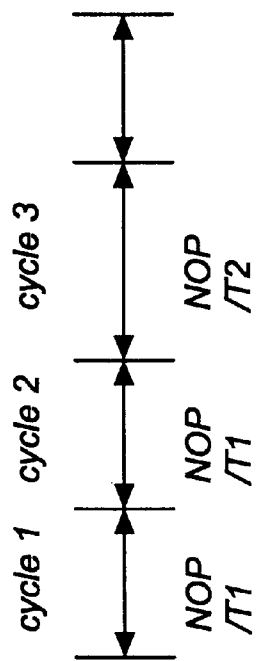
Figure 3C:
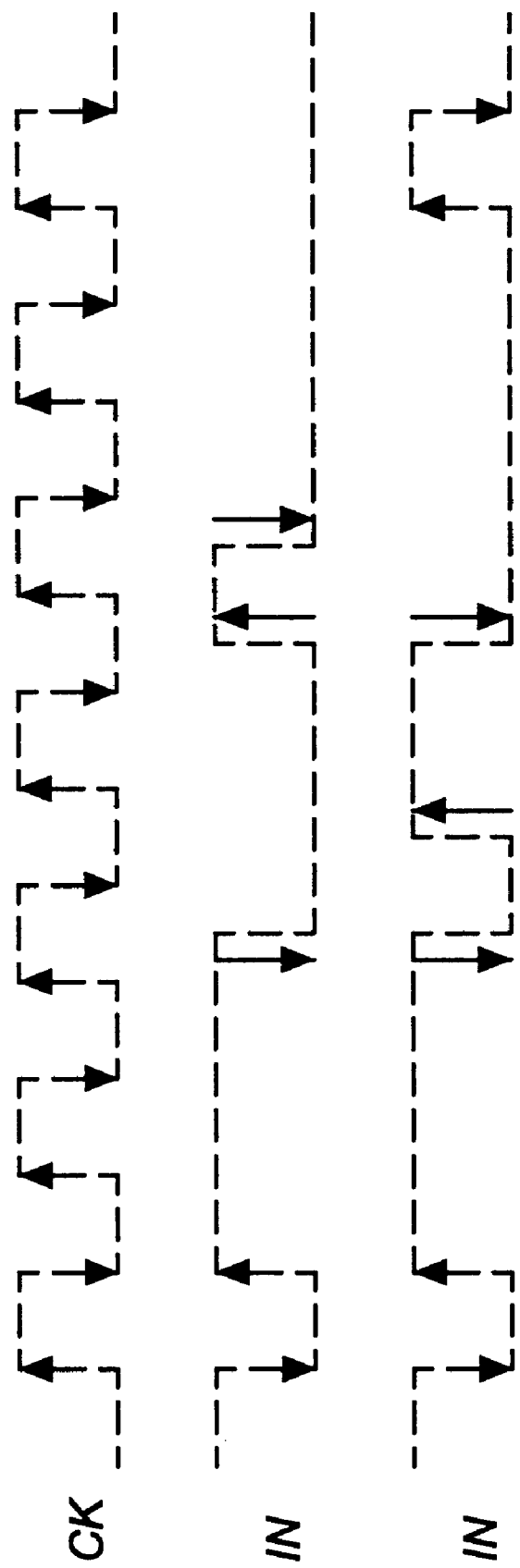

FIG. 3 is a schematic waveforms showing an image of conversion function of the cycle-event converter 22. FIG. 3A shows waveforms of the cycle based pattern data (upper drawings) and the cycle based timing data (lower drawings). The data indicating the waveforms of FIG. 3A is given to the LSI tester simulator from the pattern file $10_1$ 1 and the timing file $10_2$. The LSI tester simulator 11 produces test pattern data having a waveform image of FIG. 3B and supplies the same to the cycle-event converter 22. The cycle-event converter 22 converts the test pattern data to event data having a wave form image of FIG. 3C.

The evaluation part 24 includes a memory 25 for storing the test pattern data from the cycle-event converter 22, a memory 26 for storing the event data from the dump file 15, and a comparator 27 for synchronizing the data stored in the memory 25 and the data stored in the memory 26 and extracting the data in the memory 26 which corresponds to the output of the device under test. In this configuration, the event base test pattern is stored in the memory 25 and event base device output data is stored in the memory 26. Therefore, by synchronizing the test pattern event and the output data event, it is able to establish a relationship between the output signal of the device under test for the given input signal. For doing this, the comparator 27 studies the timing relationship between the data from the memory 25 and memory 26, and detects the output data of the memory 26 synchronized with the test pattern data in the memory 25, and outputs the same as a device output signal.

The data from the comparator 27 is given to the LSI tester simulator 11 as a resultant output of the device under test. The LSI tester simulator 11 compares the output of the comparator 27 with the expected value data at a timing of a strobe to see whether the both data match with one another. If the both data coincide, it is considered that the test patter is correct.

The evaluation part 24 in FIG. 2 may also include a device function adding circuit 28 which is able to define the relationship between input signals and output signals to diagnose failures of the device under test. The circuit 28 is programmable and the relationship between the input and output signals are adjustable depending on the type of diagnostics. For example, in a case where failure analysis of a logic circuit which is to include an analog function, operations of such a logic circuit will be evaluated by adding the analog function thereto by the device function adding circuit 28.

Figure 4:
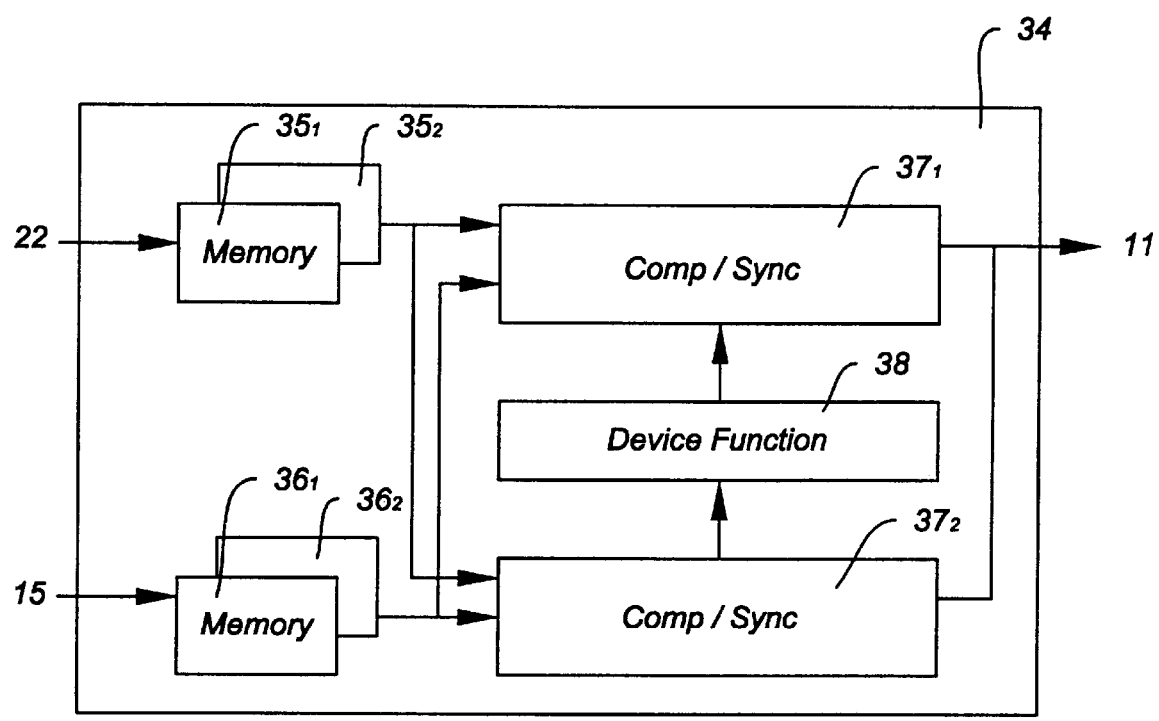
FIG. 4 is a schematic diagram showing a modified structure of the evaluation part in the semiconductor integrated circuit design and evaluation system of the present invention.

FIG. 4 is a block diagram showing another example of evaluation part in the high speed test pattern evaluation apparatus of the present invention. In this example, an evaluation part 34 includes a plurality of test pattern memories $35_1$, and $35_2$, a plurality of VCD data memories $36_1$ and $36_2$, a pair of comparators $37_1$ and $37_2$, and a device function adding circuit 38. The plurality of test pattern memories $35_1$ and $35_2$ receive the test pattern from the cycle-event converter 22 of FIG. 2 and store the same therein. Each of the memories $35_1$ and $35_2$ is formed of two small capacity memories. Preferably, the memories 35 performs an interleave function in which one memory provides the data to the comparator 37 while the other memory receives a predetermined amount of the next test pattern. Similarly, the plurality of VCD data memories $36_1$ and $36_2$ are configured by two small capacity memories which operate in an interleave fashion. Such an interleave operation achieves a high speed memory performance with the use of small capacity memories of low cost.

The comparator $37_1$, similar to the comparator 27 of FIG. 2, compares the timing relationship between the test pattern data from the memory 35 and the output data of the device under test from the memory 36 and synchronizes between the two data. The comparator $37_1$ sends the output data from the memory 36 synchronized with the test pattern data to the LSI tester simulator 11 as the device output data. The LSI tester simulator 11 compares the device output data with the expected value data to determine whether the test pattern is appropriate. Similarly, the comparator $37_2$ compares the timing relationship between the test pattern data from the memory 35 and the input data of the device under test from the memory 36 and synchronizes between the two data. The comparator $37_1$ sends the input data from the memory 36 synchronized with the test pattern data to the LSI tester simulator 11 as the device input data. The LSI tester simulator 11 compares the device input data with the test pattern to determine whether the test pattern is correct.

The device function adding circuit 38 is provided between the comparator $37_1$ and $37_2$ to define, in a programmable fashion, the relationship between input signals and output signals to diagnose failures in the device. The circuit 38 makes it possible to simulate certain types of failures in the LSI device. Further, by defining the relationship between the test pattern from the dump file and the test pattern from the LSI tester simulator, the device test results depending on the difference of the test pattern can be simulated. Moreover, although a logic simulator is not usually able to simulate an analog function, a logic device having an analog function can be evaluated by adding such functions by the device function adding circuit 38.

As described in the foregoing, according to the semiconductor integrated circuit design and evaluation system of the present invention, an LSI device is designed under the electric design automation (EDA) environment, and the test pattern for testing the LSI device produced based on the CAD data in the design stage is evaluated at high speed. By using the semiconductor integrated circuit design and evaluation system of the present invention, the test pattern is ready when the LSI devices are put into production. Thus, it is possible to put the LSI devices quickly into the market. Further, according to the semiconductor integrated circuit design and evaluation system of the present invention, it is possible to examine test pattern with a small sized dedicated hardware, at high speed, without using an actual tester.

What is claimed is:

1. A semiconductor integrated circuit design and evaluation system, comprising:

an electric design automation (EDA) environment for designing an LSI device under a computer aided design (CAD) process and evaluating functions of the designed LSI device by a device logic simulator;

a dump file for storing data expressed by an event base which shows results of logic simulation including input/output data of the designed LSI device obtained by executing the device logic simulator as a part of the CAD process for the LSI device in the EDA environment, wherein the input/output data expressed by the event base defines each change point of input/output signal and a timing of the change point with reference to a predetermined reference point;

means for extracting timing data and pattern data expressed by a cycle base from the input/output data in the dump file expressed by the event base, wherein the data expressed by the cycle base defines the timing and pattern relative to a corresponding test cycle;

an LSI tester simulator formed of software for simulating an operation of an LSI tester and generating, based on the timing data and pattern data in the cycle base, a test pattern for testing the LSI device and an expected value pattern for comparing the output of the LSI device which is responsive to the test pattern, the test pattern and the expected value pattern being in the cycle base;

a cycle-event converter for converting the test pattern in the cycle base from the LSI tester simulator to a test pattern of the event base;

a first memory for storing the event based test pattern from the cycle-event converter;

a second memory for storing the event based input/output data of the LSI device from the dump file; and a comparator for synchronizing the data stored in the first and second memories by comparing the timing relationship between the two data and extracting output data of the LSI device from the dump file corresponding to the test pattern from the LSI tester simulator;

whereby the test pattern produced by the LSI tester simulator is evaluated with reference to the data from the dump file produced through the logic simulation of the LSI device by the device logic simulator, thereby evaluating the test pattern without using an actual LSI tester or an LSI device.

2. A semiconductor integrated circuit design and evaluation system as defined in claim 1, wherein the device logic simulator in the EDA environment includes a logic simulator and a device model described in a language which is interpreted by the logic simulator wherein the device model simulates operations of the LSI device designed through the CAD process.

3. A semiconductor integrated circuit design and evaluation system as defined in claim 1, wherein the cycle-event converter and the comparator are formed of hardware.

4. A semiconductor integrated circuit design and evaluation system as defined in claim 1, wherein the cycle-event converter is formed of software and the comparator is formed of hardware.

5. A semiconductor integrated circuit design and evaluation system as defined in claim 1, further comprising a device function adding circuit for providing data which adds or modifies functions of the device under test.

6. A semiconductor integrated circuit design and evaluation system, comprising:

an electric design automation (EDA) environment for designing an LSI device under a computer aided design (CAD) process and evaluating functions of the designed LSI device by a device logic simulator;

a dump file for storing data expressed by an event base which shows results of logic simulation including input/output data of the designed LSI device obtained by executing the device logic simulator as a part of the CAD process for the LSI device in the EDA environment, wherein the input/output data expressed by the event base defines each change point of input/output signal and a timing of the change point with reference to a predetermined reference point;

means for extracting timing data and pattern data expressed by a cycle base from the input/output data in the dump file expressed by the event base, wherein the data expressed by the cycle base defines the timing and pattern relative to a corresponding test cycle;

an LSI tester simulator formed of software for simulating an operation of an LSI tester and generating, based on the timing data and pattern data in the cycle base, a test pattern for testing the LSI device and an expected value pattern for comparing the output of the LSI device which is responsive to the test pattern, the test pattern and the expected value pattern being in the cycle base;

a cycle-event converter for converting the test pattern in the cycle base from the LSI tester simulator to a test pattern of the event base;

a first memory for storing the event based test pattern from the cycle-event converter;

a second memory for storing the event based input/output data of the LSI device from the dump file;

a first comparator for synchronizing the data stored in the first and second memories by comparing a timing relationship between the two corresponding pieces of data and extracting output data of the LSI device from the dump file corresponding to the test pattern from the LSI tester simulator;

a second comparator for synchronizing the data stored in the first and second memories by comparing a timing relationship between the two corresponding pieces of data and extracting input data of the LSI device from the dump file corresponding to the test pattern from the LSI tester simulator; and a device function adding circuit provided between the first memory and the second memory for providing data which adds hypothetical functions to the LSI device under test;

whereby the test pattern produced by the LSI tester simulator is evaluated with reference to the data from the dump file produced through the logic simulation of the LSI device by the device logic simulator, thereby evaluating the test pattern without using an actual LSI tester or an LSI device.

7. A high speed test pattern evaluation apparatus as defined in claim 6, wherein each of the first memory and second memory is comprised of a plurality of memories which perform an interleave function, thereby reading and writing data alternately with one another.

8. A semiconductor integrated circuit design and evaluation system as defined in claim 6, wherein the cycle-event converter and the comparator are formed of hardware.

9. A semiconductor integrated circuit design and evaluation system as defined in claim 6, wherein the cycle-event converter is for med of software and the comparator is formed of hardware.

10. A semiconductor integrated circuit design and evaluation system as defined in claim 6, wherein the device logic simulator in the EDA environment includes a logic simulator and a device model described in a language which is interpreted by the logic simulator wherein the device model simulates operations of the LSI device designed through the CAD process.

* * * * *